United States Patent
Konishi

(10) Patent No.: US 6,472,292 B2
(45) Date of Patent: Oct. 29, 2002

(54) PROCESS OF MANUFACTURING SEMICONDUCTOR DEVICE

(75) Inventor: Akito Konishi, Fukuyama (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/986,053

(22) Filed: Nov. 7, 2001

(65) Prior Publication Data

US 2002/0068413 A1 Jun. 6, 2002

(30) Foreign Application Priority Data

Dec. 1, 2000 (JP) ...................................... 2000-367444

(51) Int. Cl.⁷ ............................................. H01L 21/76
(52) U.S. Cl. ........................ 438/427; 438/435; 438/437; 438/424; 438/692
(58) Field of Search ................................ 438/435, 439, 438/692, 424, 427

(56) References Cited

U.S. PATENT DOCUMENTS

| | | | | |
|---|---|---|---|---|
| 5,702,977 A | * | 12/1997 | Jang et al. ............ | 148/DIG. 50 |
| 5,719,085 A | * | 2/1998 | Moon et al. ......... | 148/DIG. 50 |
| 6,242,352 B1 | * | 6/2001 | Chen et al. ................. | 438/691 |
| 6,294,470 B1 | * | 9/2001 | Economikos et al. ...... | 252/79.1 |
| 6,335,287 B1 | * | 1/2002 | Hwang et al. .............. | 438/692 |
| 6,391,792 B1 | * | 5/2002 | Jang et al. .................. | 438/691 |
| 6,403,483 B1 | * | 6/2002 | Hao et al. ................... | 438/692 |

FOREIGN PATENT DOCUMENTS

JP        11-26571        1/1999

* cited by examiner

Primary Examiner—Trung Dang
(74) Attorney, Agent, or Firm—Nixon & Vanderhye, P.C.

(57) ABSTRACT

A method of manufacturing a semiconductor device including a plurality of active regions of different area and device isolation regions formed between the active regions, the method including the steps of: forming a first insulating film and a second insulating film in sequence on a semiconductor substrate; forming a plurality of openings through the first and second insulating films at desired positions; forming trenches in the semiconductor substrate in the openings to define active regions of different area and device isolation regions between the active regions; depositing a third insulating film on the semiconductor substrate so that the trenches are filled with the third insulating film; flattening the third insulating film by CMP until the second insulating film is exposed in the active regions; and removing the third insulating film remaining in the active regions because of a difference in polishing rate derived from variation in deposit density in the third insulating film and simultaneously reducing the third insulating film in the trenches.

4 Claims, 8 Drawing Sheets

PROCESS OF MANUFACTURING SEMICONDUCTOR DEVICE

CROSS-REFERENCE TO RELATED APPLICATION

This application is related to Japanese patent application No. 2000-367444 filed on Dec. 1, 2000, whose priority is claimed under 35 USC §119, the disclosure of which is incorporated by reference in its entirety.

BACKGROUND OF THE INVENTION

1. Field of the Invention

The present invention relates to a method of manufacturing a semiconductor device, and more particularly, to a method of manufacturing a semiconductor device characterized by a process of forming a device isolation region of a integrated circuit.

2. Description of Related Art

According to recent high integration of semiconductor devices, miniaturization of devices and device isolation regions is being carried out.

The device isolation regions are formed by a trench device isolation technique including the steps of forming trenches in a surface of a semiconductor substrate, forming an insulating film to fill the trenches, and flattening the insulating film.

Such a technique may be suitable for the miniaturization of the device isolation regions. However, if the device isolation regions are formed at a level lower than that of the semiconductor surface, an electric field is concentrated at a channel boundary of the transistor and a hump current is generated.

In view of such a problem, Japanese Unexamined Patent Publication No. Hei 11(1999)-26571 proposes a method of preventing the device isolation regions from being formed below a surface of a silicon substrate. The method is detailed below referring to FIGS. 2 and 3.

First, an oxide film 202 of about 100Å thick is formed on a silicon substrate 201 by oxidation diffusion and then a nitride film 203 of about 2000Å thick is formed thereon by known CVD as shown in FIG. 2A. Then, the nitride film 203 is patterned by known photolithography and anisotropic etching as shown in FIG. 2B such that the oxide film 202 is exposed in a device isolation region-to-be. With the thus patterned nitride film 203 as a mask, the oxide film 202 is etched and the silicon substrate 201 is also etched to form a trench 204 for device isolation with a depth of about 0.2–0.7 μm as shown in FIG. 2C. The nitride film 203 is then isotropically etched in a hot phosphoric acid solution such that the nitride film 203 is isotropically reduced from each sidewall of the trench, i.e., from the position indicated by the broken line shown in FIG. 2D, towards the center of a region for forming a transistor by about 500Å. The silicon substrate 201 is oxidized to form an oxide film 205 of about 150Å thick at the bottom and sides of the trench 204 as shown in FIG. 2E. Then, an oxide film 206 of about 0.4–1.0 μm is deposited by CVD as shown in FIG. 2F. The oxide film 206 is flattened by CMP (Chemical Mechanical Polishing) until the nitride film 203 is exposed as shown in FIG. 2G. The nitride film 203 is removed in a hot phosphoric acid solution as shown in FIG. 2H, and then the oxide film 202 is removed to complete the trench device isolation structure as shown in FIG. 2I.

According to such a technique, the top surface of the device isolation region is prevented from being located below the silicon substrate surface, which allows avoiding the generation of the hump current.

However, on a large active region 301 and an isolated small active region 302 as shown in FIG. 3A, the oxide film 206 is deposited at different density. When the oxide film 206 is flattened, it is polished at different polishing rate between the large active region 301 and the isolated small active region 302. As a result, the oxide film remains on the large active region 301 as indicated by reference numeral 303 shown in FIG. 3B, which hinders the nitride film 203 from being completely removed in a later step. Even if the oxide film 206 is polished for a longer period so that the remain 303 of the oxide film is completely removed, the nitride film 203 on the isolated small active region 302 is greatly polished, and the underlying active region 302 may possibly be polished. Thus, in this method, it is difficult to estimate the optimum amount to be polished. Further, as shown in FIG. 3C, the level of the buried oxide film 206 and that of the silicon substrate 201 are significantly different, which causes focus offset in the lithography step for patterning a gate electrode wiring 304. Moreover, since a thickness of the gate electrode wiring 304 increases on the step portion, the wiring 304 is not fully etched away and remains as indicated by reference numeral 305 as shown in FIG. 3D, which causes short circuit between the electrodes.

SUMMARY OF THE INVENTION

In view of the above problems, an object of the present invention is to provide a method of manufacturing a semiconductor device, the method capable of preventing the oxide film on the active regions from remaining due to the difference in polishing rate depending on the difference in dimension of the underlying active regions, and reducing the level difference between the device isolation region and the active region which causes the focus offset in the lithography step for patterning the gate electrode wiring and the incomplete removal of the wiring.

The inventor of the present invention has found that the above-mentioned problems are solved by removing the remain of the insulating film on the active regions generated due to the difference in polishing rate depending on the difference in dimension of the underlying active region and simultaneously reducing the insulating film buried in the trench.

According to the present invention, provided is a method of manufacturing a semiconductor device including a plurality of active regions of different area and device isolation regions formed between the active regions, the method comprising the steps of: forming a first insulating film and a second insulating film in sequence on a semiconductor substrate; forming a plurality of openings through the first and second insulating films at desired positions; forming trenches in the semiconductor substrate in the openings to define active regions of different area and device isolation regions between the active regions; depositing a third insulating film on the semiconductor substrate so that the trenches are filled with the third insulating film; flattening the third insulating film by CMP until the second insulating film is exposed in the active regions; and removing the third insulating film remaining in the active regions because of a difference in polishing rate derived from variation in deposit density in the third insulating film and simultaneously reducing the third insulating film in the trenches.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Hereinafter, the steps of manufacturing the semiconductor device including the trench device isolation regions according to the present invention will be explained in detail with reference to FIGS. 1.

Since the following embodiment is merely for the explanation of the present invention, the invention is not limited thereto. The method of the present invention is also applicable to other memory devices as DRAM, SRAM and FLASH.

The scope of the present invention is not limited by the technique, structure, material, dimension, film thickness and amount employed in the following embodiment unless any particular limitation is made.

Figure 1A:
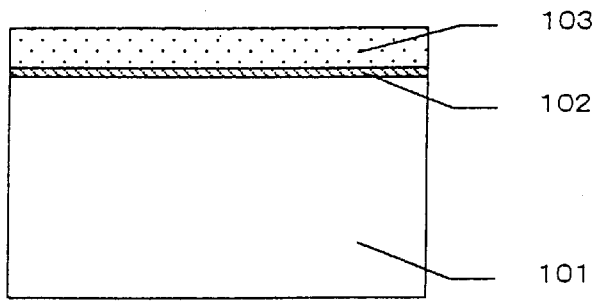
FIGS. 1A to 1K are schematic sectional views of a major part illustrating a method of manufacturing a semiconductor device according to the present invention.

Referring to in FIG. 1A, a pad oxide film 102 of about 10 nm thick is formed as a first insulating film on a silicon substrate 101 as a semiconductor substrate by thermal oxidation.

The semiconductor substrate may be formed of other materials than silicon. For example, various substrates such as an element semiconductor substrate made of germanium, a compound semiconductor substrate made of GaAs or InGaAs, a SOI substrate and a multilayer SOI substrate are applicable.

The first insulating film may be a silicon oxide film, a silicon nitride film, a SOG film, a PSG film, a BSG film or a BPSG film. The first insulating film may be formed by a known method, though it varies depending on the material thereof.

On the pad oxide film 102, a silicon nitride film 103 of about 100–200 nm thick is deposited as a second insulating film by reduced pressure CVD.

The second insulating film may be other films than the silicon nitride film such as a film same as the first insulating film, but a film which is etched with an etching solution or at an etching rate different from that used for etching the first insulating film and a third insulating film to be mentioned later. In particular, a silicon nitride film which has been commonly used as a stopper film for CMP is preferable. The second insulating film preferably has a thickness of about 80–300 nm, for example, so that it can be used as the stopper film for CMP.

The second insulating film may be formed by a common method, though it varies depending on the material thereof.

Figure 1B:
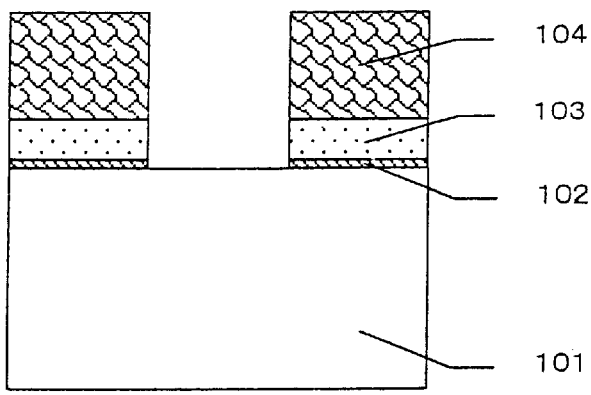
Figure 1C:
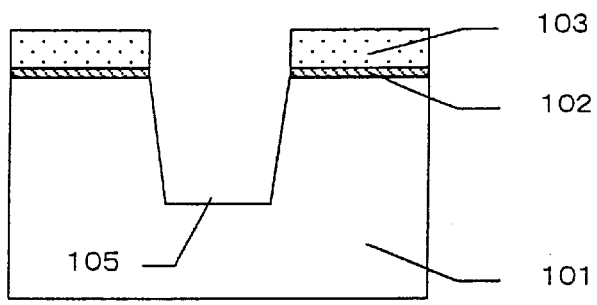

Referring to FIG. 1B, a resist pattern 104 having an opening in a device isolation region-to-be is formed by photolithography. Using the resist pattern 104 as a mask, the silicon nitride film 103 and the pad oxide film 102 are anisotropically etched in sequence. Then, the silicon substrate 101 is also etched anisotropically to form a trench 105 having a depth of about 200–400 nm as shown in FIG. 1C.

Figure 1D:
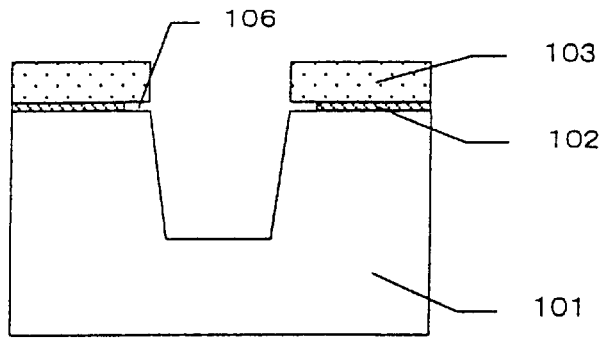

The resist pattern 104 is then removed by ashing. Thereafter, the pad oxide film 102 is reduced in a horizontal direction by isotropic wet etching using hydrofluoric acid such that the edge of the pad oxide film 102 under the silicon nitride film 103 is reduced towards the center of the active region by about 20–40 nm from each sidewall of the trench 105. Thus, a undercut 106 is formed, as shown in FIG. 1D.

At the thermal oxidation to oxidize the sidewalls of the trench the semiconductor substrate to be described later, the silicon substrate surface exposed in the thus formed undercut 106 is oxidized simultaneously, thereby corners at the top of the trench are rounded. The thus rounded corners are preferable because they effectively prevent the hump current generated by the electric field concentrated at sharp corners.

Figure 1E:
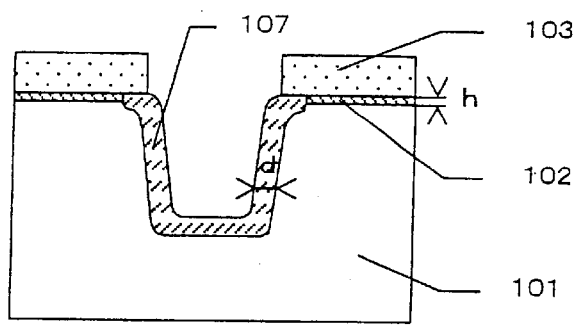

Then, referring to FIG. 1E, thermal oxidation is carried out to form an oxide film 107 of about 30 nm thick on the exposed surface of the silicon substrate 101, i.e., the inner surface of the trench and the silicon surface exposed in the undercut 106. At this time, the oxide film 107 preferably has thickness d twice or more greater than thickness h of the pad oxide film 102 such the undercut 106 is filled with the oxide film 107.

With the thus formed oxide film 107, corners at the bottom of the trench are rounded. Accordingly, stress caused by a thermal budget required for the manufacture of the semiconductor device is alleviated and generation of crystal defect is inhibited. This is preferable because a leak current is effectively avoided.

Figure 1F:
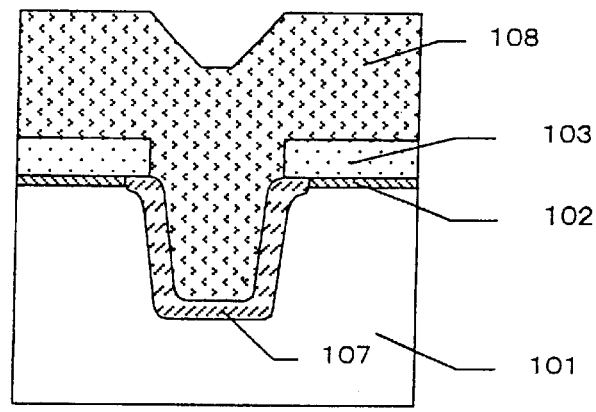

Then, referring to FIG. 1F, an oxide film 108 of about 400–600 nm thick is deposited as a third insulating film on the entire surface of the silicon substrate 101 by CVD or rotational application such that the trench 105 is filled.

The third insulating film may be other films than the oxide film such as a film same as the first insulating film, but used is a film which is etched with an etching solution or at an etching rate different from that for etching the second insulating film. In particular, a silicon oxide film is preferable.

The third insulating film may be formed by a known method, though it varies depending on the material thereof.

The thickness of the buried oxide film 108 is at least the same as or greater than the depth of the trench 105.

Figure 1G:
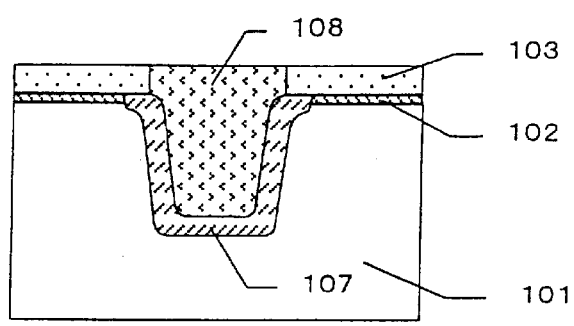

Referring to FIG. 1G, the buried oxide film 108 is polished by CMP to flatten the surface roughness on the buried oxide film 108.

Detection of the termination of the flattening (End Point Detection=EPD) is carried out by monitoring variation in current flowing through a spindle motor caused by variation in load on the motor derived from variation in friction force of the surface under polishing. The polishing is carried out until the buried oxide film 108 on the silicon nitride film 103 which serves as a polish stopper is completely removed.

Figure 1H:
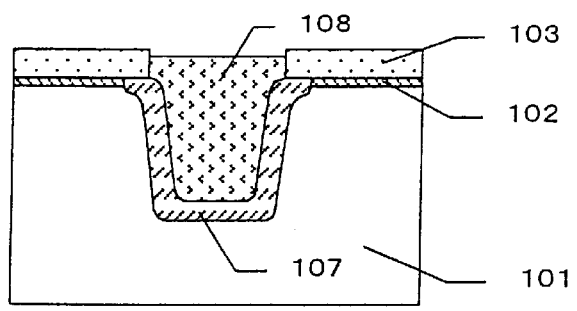
Figure 3A:
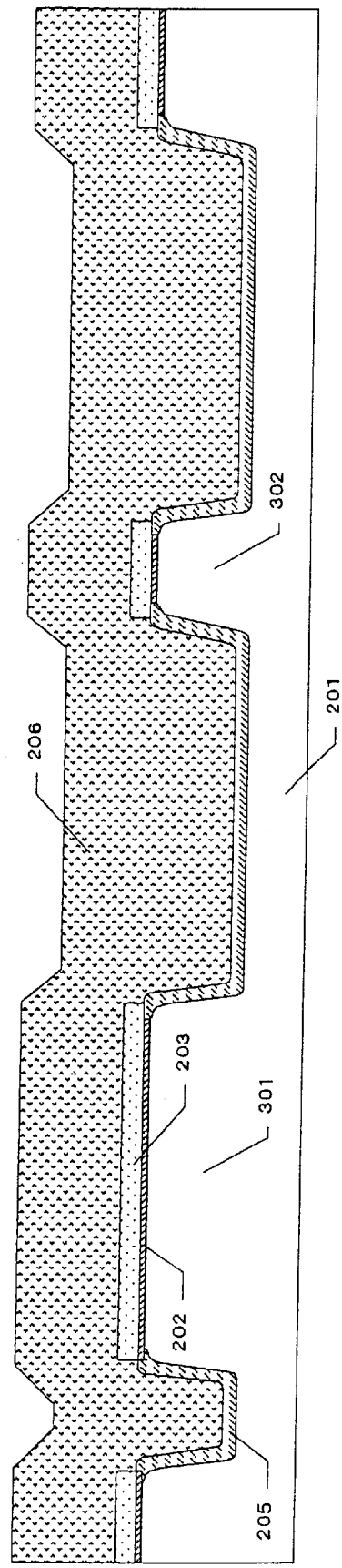
FIGS. 3A to 3D are schematic sectional views of major parts illustrating a method of manufacturing a semiconductor device according to the prior art.
Figure 3B:
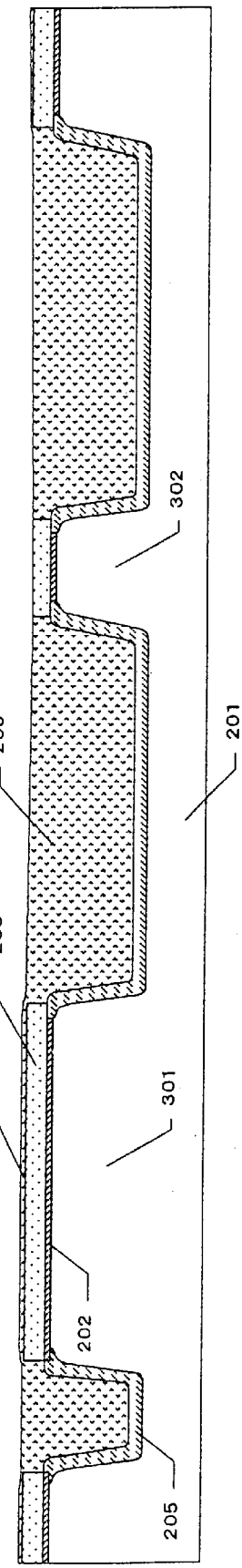
Figure 3C:
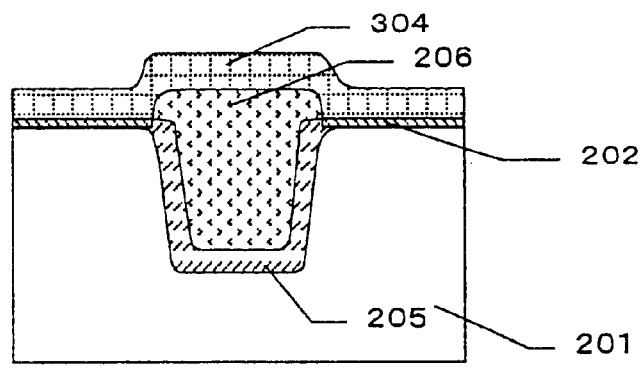
Figure 3D:
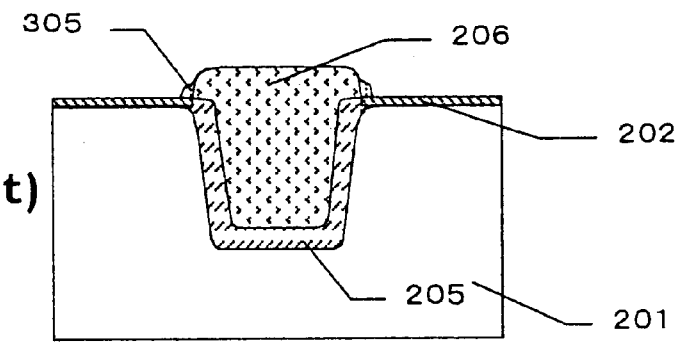

Then, the thickness of the buried oxide film 108 in the trench is reduced by about 10 nm so that the level difference between the surface of the silicon substrate 101 and the surface of the buried oxide film 108 is reduced as shown in FIG. 1H. At this time, if the oxide film 206 remains as indicated by reference numeral 303 on a large active region 301 because the polishing rate is different between the large active region 301 and an isolated small active region 302 due to difference in dimension of the active regions as shown in FIGS. 3A and 3B, the remain 303 of the oxide film is simultaneously removed.

The reduction of the buried oxide film 108 and the removal of the remain 303 of the oxide film may be carried out by wet etching using a dilute hydrofluoric acid solution as an etchant or by reactive ion etching, depending on the material of the third insulating film.

The amount of the oxide film to be reduced is not particularly limited as long as it is adjusted such that the level of the buried oxide film 108 in the trench adjacent to an isolated small active region where the etching progresses faster is not located below the level of the surface of the silicon substrate 101 in active region, while considering that the buried oxide film will be further reduced during the removal of the pad oxide film 102 to be described later. For example, the level difference between the buried oxide film 108 and the surface of the silicon substrate 101 in the active region is preferably in the range of 30–80 nm.

Figure 1I:
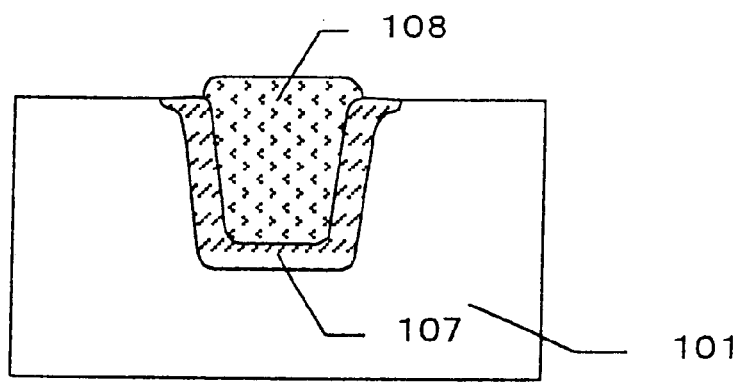

Then, referring to FIG. 1I, the silicon nitride film 103 is removed with a hot phosphoric acid solution and the pad oxide film 102 is removed with a dilute hydrofluoric acid solution.

Figure 1J:
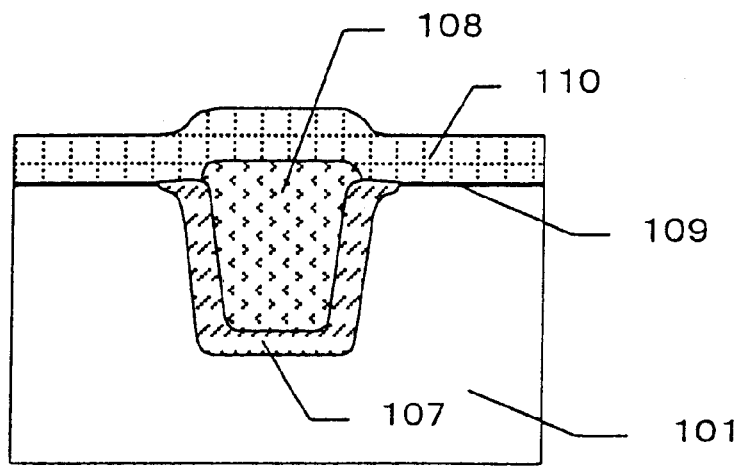

Then, impurities are injected by a known method to form wells (not shown). The surface of the silicon substrate 101 is oxidized to form a gate insulating film 109 of about 3–10 nm and a gate electrode wiring 110 of about 150–300 nm is formed by CVD as shown in FIG. 1J.

Figure 1K:
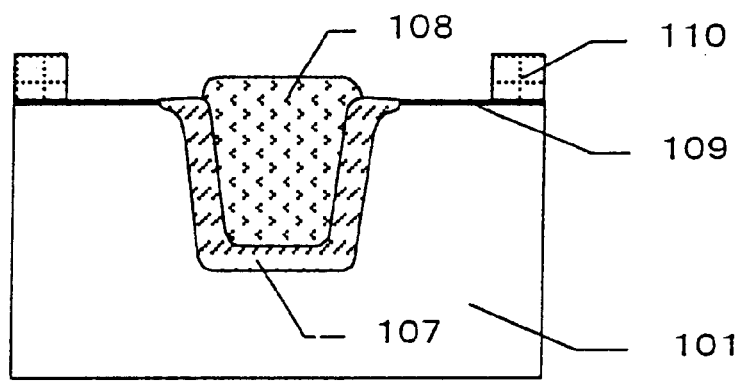
Figure 2A:
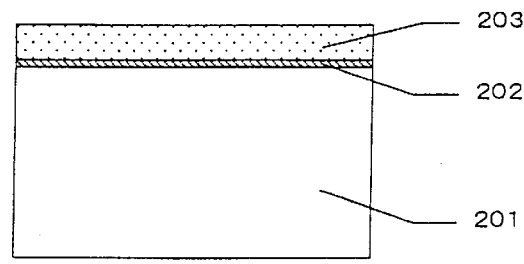
FIGS. 2A to 2I are schematic sectional views of a major part illustrating a method of manufacturing a semiconductor device according to the prior art.
Figure 2B:
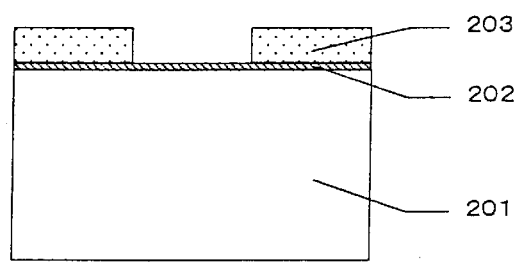
Figure 2C:
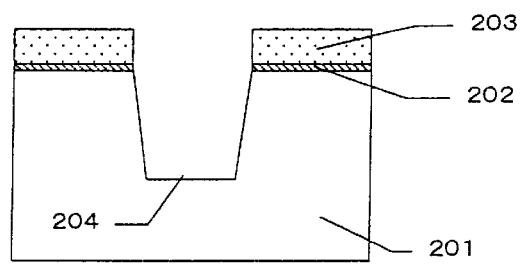
Figure 2D:
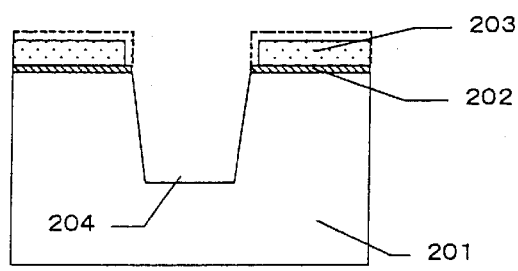
Figure 2E:
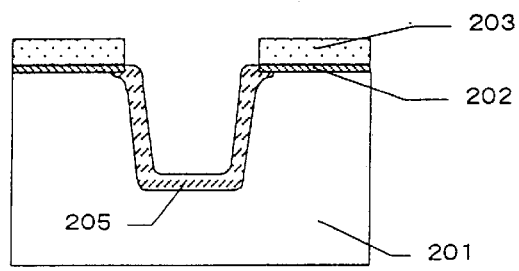
Figure 2F:
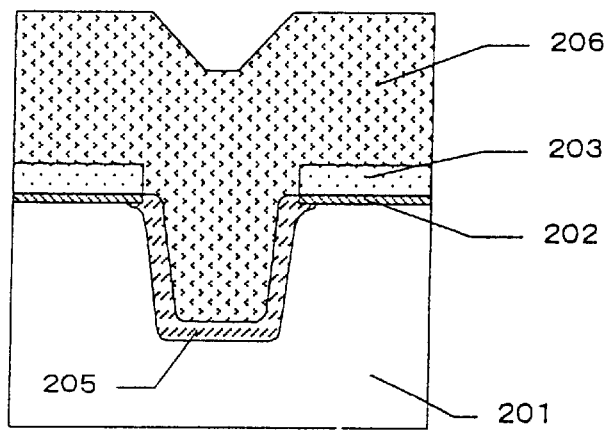
Figure 2G:
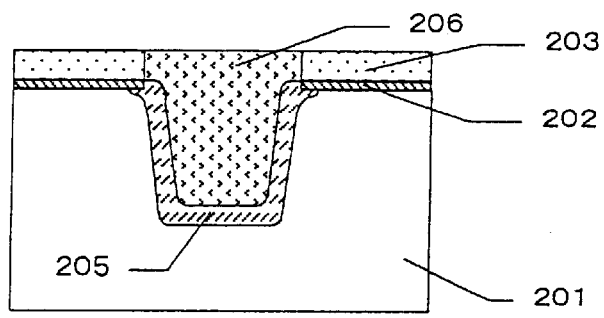
Figure 2H:
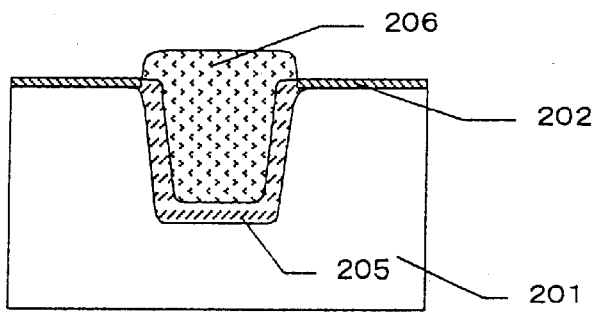
Figure 2I:
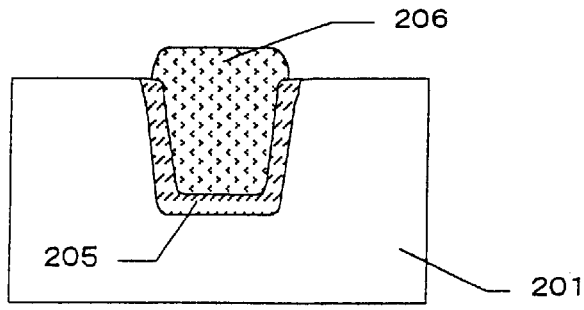

The gate electrode wiring 110 is then patterned by a known technique as shown in FIG. 1K and source/drain regions are formed (not shown), thereby completing the trench device isolation semiconductor device.

According to the present invention, as described above, wet etching using a dilute hydrofluoric acid solution is performed after the flattening by CMP. Therefore, the oxide film which remained because of the difference in dimension of the underlying active regions is removed, which eliminates the need of adjusting the polish amount during CMP. Simultaneously, the oxide film buried in the trench (device isolation region) is also reduced, so that the level difference between the active region and the device isolation region is decreased. As a result, the focus offset in the photolithography step for patterning the gate electrode wiring and the incomplete etching of the wiring are avoided.

What is claimed is:

1. A method of manufacturing a semiconductor device including a plurality of active regions of different area and device isolation regions formed between the active regions, the method comprising the steps of:

forming a first insulating film and a second insulating film in sequence on a semiconductor substrate;

forming a plurality of openings through the first and second insulating films at desired positions;

forming trenches in the semiconductor substrate in the openings to define active regions of different area and device isolation regions between the active regions;

depositing a third insulating film on the semiconductor substrate so that the trenches are filled with the third insulating film;

flattening the third insulating film by CMP until the second insulating film is exposed in the active regions; and removing the third insulating film remaining in the active regions because of a difference in polishing rate derived from variation in deposit density in the third insulating film and simultaneously reducing the third insulating film in the trenches.

2. A method according to claim 1, wherein the third insulating film is a silicon oxide film, and the step of removing the remaining third insulating film and simultaneously reducing the third insulating film in the trenches is carried out by wet etching using a dilute hydrofluoric acid solution as an etchant.

3. A method according to claim 1, wherein an additional step of forming an oxide film by thermally oxidizing an inner surface of the trenches is inserted between the step of forming the trenches and the step of filling the trenches.

4. A method according to claim 3, wherein an additional step of reducing the first insulating film is inserted between the step of forming the trenches and the step of forming an oxide film.

* * * * *